(12) United States Patent
Miyazaki

(10) Patent No.: US 10,614,893 B2
(45) Date of Patent: Apr. 7, 2020

(54) NONVOLATILE MEMORY DEVICE, SEMICONDUCTOR DEVICE, AND ELECTRONIC APPARATUS

(71) Applicant: SEIKO EPSON CORPORATION, Tokyo (JP)

(72) Inventor: Takeshi Miyazaki, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 63 days.

(21) Appl. No.: 15/969,149

(22) Filed: May 2, 2018

(65) Prior Publication Data

US 2018/0336952 A1 Nov. 22, 2018

(30) Foreign Application Priority Data

May 17, 2017 (JP) .................. 2017-097935

(51) Int. Cl.
*G11C 16/28* (2006.01)
*G11C 16/34* (2006.01)
*G11C 16/08* (2006.01)
*G11C 16/30* (2006.01)
*G11C 16/04* (2006.01)

(52) U.S. Cl.
CPC .............. *G11C 16/28* (2013.01); *G11C 16/08* (2013.01); *G11C 16/30* (2013.01); *G11C 16/3459* (2013.01); *G11C 16/0408* (2013.01); *G11C 16/0425* (2013.01); *G11C 2207/063* (2013.01)

(58) Field of Classification Search
CPC ..... G11C 16/28; G11C 16/08; G11C 16/3459; G11C 16/0408

USPC ....................................... 365/185.12
See application file for complete search history.

(56) References Cited

U.S. PATENT DOCUMENTS

| 2007/0170956 A1* | 7/2007 | Su ................. G11C 7/062 327/55 |
| 2015/0170726 A1* | 6/2015 | Antonyan .......... G11C 11/1673 365/158 |
| 2016/0239367 A1* | 8/2016 | Park .................. G11C 29/24 |
| 2018/0336953 A1* | 11/2018 | Miyazaki .............. G11C 16/28 |

FOREIGN PATENT DOCUMENTS

| JP | 2012-146374 A | 8/2012 |
| JP | 2016-170846 A | 9/2016 |
| JP | 2016-170847 A | 9/2016 |
| JP | 2016-225004 A | 12/2016 |

* cited by examiner

*Primary Examiner* — Anthan Tran
(74) *Attorney, Agent, or Firm* — Oliff PLC

(57) ABSTRACT

A nonvolatile memory device includes: a first reference cell; a second reference cell; a circuit that generates a first mirror current proportional to a current flowing through the first reference cell; a circuit that generates a second mirror current proportional to a current flowing through the second reference cell; a sense amplifier that reads out data by comparing a current flowing through a memory cell with a reference current; and a selection circuit that sets a selection state of the first reference cell and the second reference cell such that, in a readout mode, the reference current is generated based on at least the first mirror current, and in a verify mode, the reference current is generated based on the second mirror current.

12 Claims, 7 Drawing Sheets

NONVOLATILE MEMORY DEVICE, SEMICONDUCTOR DEVICE, AND ELECTRONIC APPARATUS

CROSS REFERENCE

This application claims priority to Japanese Patent Application No. 2017-097935, filed on May 17, 2017, the entire disclosure of which is expressly incorporated herein by reference.

BACKGROUND

1. Technical Field

The present invention relates to electrically rewritable nonvolatile memory devices such as a flash memory and an EEPROM (Electrically Erasable Programmable Read-Only Memory). Furthermore, the invention relates to semiconductor devices, electronic apparatuses, and the like that use such nonvolatile memory devices.

2. Related Art

In recent years, electrically rewritable nonvolatile memory devices such as a flash memory and an EEPROM have come into wide used. In such nonvolatile memory devices, in order to determine whether a memory cell is in an erased state or in a programmed state, a reference current is generated based on currents that flow through a plurality of reference cells, and the current flowing through the memory cell is compared with the reference current.

As a related technology, in JP-A-2012-146374 (Paragraphs 0025 and 0026, 0078 and 0079, FIGS. 1 and 4), a reference current generation circuit is disclosed with which an operation margin can be widened when data is read out from a nonvolatile memory cell. The reference current generation circuit includes a first reference cell that is set in the erased state and a second reference cell that is set in the programmed state, and a current resulting from adding a current corresponding to a first current that flows through the first reference cell in a selected state and a current corresponding to a second current that flows through the second reference cell in a selected state is generated as the reference current.

In general, in nonvolatile memory devices, after data has been written into a memory cell, whether or not the written data can be properly read out is confirmed (verified). Considering a change in temperature and a power supply voltage, the determination reference for determining whether or not the data is properly written is desired to be set more precisely in a verify mode than in a normal readout mode.

The threshold voltage of a memory cell transistor that has been set in the programmed state when data has been written is higher than that before writing, therefore, in order to set the determination reference precisely when it is determined whether or not a memory cell is properly programmed, a reference current that gradually changes with respect to the change in the drive potential applied to the cell needs to be generated.

However, in the reference current generation circuit disclosed in JP-A-2012-146374, when the current flowing through the programmed state second reference cell steeply rises on a high potential side, the reference current also steeply rises on a high potential side (refer to Paragraph 0079, FIG. 4) following the rise. If such a reference current is used in the verify mode, the determination reference cannot be precisely set when verifying whether or not a memory cell is properly programmed.

Also, in the case where the number of bits of data that is read out at the same time in a readout mode is large, a current mirror circuit that generates a current corresponding to the current flowing through a reference cell is connected to a large number of sense amplifiers, and an interconnect length increases, and as a result, the load capacitance of the current mirror circuit increases, and it takes time for the reference current to stabilize. Specifically, this problem becomes apparent with respect to the programmed state reference cell whose threshold voltage is high, because the current supply capability is low.

SUMMARY

An advantage of some aspects of the invention is to provide a nonvolatile memory device in which a determination reference is precisely set when verifying whether or not a memory cell is properly programmed to a programmed state in which the threshold voltage is high. Also, another advantage of some aspects of the invention is to improve the current supply capability of a reference cell used for generating a reference current so as to reduce the time it takes for the reference current to stabilize in a readout mode, in such a nonvolatile memory device. A further advantage of some aspects of the invention is to provide a semiconductor device, an electronic apparatus, and the like that use such a nonvolatile memory device.

A nonvolatile memory device according to a first aspect of the invention includes: a first reference cell in an intermediate state between an erased state and an programmed state or in the programmed state; a second reference cell in the erased state; a first current mirror circuit that generates a first mirror current proportional to a current flowing through the first reference cell in a state in which the first reference cell is selected; a second current mirror circuit that generates a second mirror current proportional to a current flowing through the second reference cell in a state in which the second reference cell is selected; a sense amplifier that reads out data stored in a memory cell by comparing a current flowing through the memory cell with a reference current; and a selection circuit that sets a selection state of the first reference cell and the second reference cell such that, in a readout mode, the reference current is generated based on at least the first mirror current, and in a verify mode, the reference current is generated based on the second mirror current.

According to the first aspect of the invention, in the verify mode, the reference current is generated based on the second mirror current proportional to the current flowing through the erased state second reference cell whose threshold voltage is low, and as a result, a reference current that moderately changes relative to that in the readout mode with respect to the change in the drive potential applied to the cell can be generated. Accordingly, when verifying whether or not the memory cell is properly programmed to the programmed state in which the threshold voltage is high, the determination reference can be precisely set.

Here, the selection circuit may set a state of connection between the first reference cell and the first current mirror circuit or a connection state of the first current mirror circuit such that the first mirror current is generated in the readout mode, and the first mirror current is not generated in the verify mode. With this, the first reference cell can be set to a selected or unselected state.

Also, the reference current may be generated based on the first mirror current and the second mirror current in the readout mode. With this, even in a low voltage state in which a current does not flow through the first reference cell, the reference current can be generated using the second reference cell.

Alternatively, the first reference cell may be set to the intermediate state between the erased state and the programmed state. With this, the current supply capability of the reference cell used for generating the reference current can be improved, and it is possible to reduce the time it takes for the reference current to stabilize in the readout mode. As a result, high-speed readout of data is made possible.

In this case, the selection circuit may set a state of connection between the second reference cell and the second current mirror circuit or the connection state of the second current mirror circuit such that the second mirror current is generated in the verify mode, and the second mirror current is not generated in the readout mode. Accordingly, the reference current can be generated, in the readout mode, at a high speed using only the intermediate state first reference cell, and the operation margin can be increased compared with a case where both the first and second reference cells are used, because the reference current changes similarly to the current flowing through the memory cell with respect to a change in temperature or the power supply voltage.

Alternatively, the nonvolatile memory device may further include: a voltage detection circuit that activates a detection signal when a power supply voltage is higher than a predetermined voltage; and a selection control circuit that controls the selection circuit such that, in the readout mode, the reference current is generated based on the first mirror current when the detection signal is activated, and the reference current is generated based on the first mirror current and the second mirror current when the detection signal is not activated.

Accordingly, when the power supply voltage is relatively high, the reference current can be generated at a high speed using only the first reference cell. On the other hand, when the power supply voltage is relatively low, although the intermediate state first reference cell is not easily turned on, the reference current can be generated using the second reference cell, even if the first reference cell is not turned on.

In the foregoing configurations, the second current mirror circuit may be configured such that a mirror ratio can be changed. Accordingly, the reference current can be changed with a simple configuration without increasing the number of reference cells or adjusting the drive potential of the reference cell, and the determination reference in the verify mode can be set.

Also, the nonvolatile memory device may further include: a first transistor that is connected to the first current mirror circuit and the second current mirror circuit, and through which the first mirror current, the second mirror current, or the first mirror current and the second mirror current flow. The sense amplifier includes a second transistor that constitutes a third current mirror circuit together with the first transistor, and the second transistor allows the reference current proportional to a current flowing through the first transistor to flow. Accordingly, even if a current is amplified by the first or the second current mirror circuit in order to drive the load, the magnitude of the reference current can be appropriately set by the third current mirror circuit.

In this case, the third current mirror circuit may generate a current whose magnitude is approximately the same as a current flowing through the first reference cell, based on the first mirror current, and generates a current whose magnitude is $\beta$ ($0<\beta<1$) times a current flowing through the second reference cell, based on the second mirror current.

Accordingly, in the readout mode, the amount of change in the reference current with respect to a change in the drive potential approximates the amount of change in the current flowing through the first reference cell, and as a result, the influence of a change in temperature or the power supply voltage can be reduced. Also, in the verify mode, the amount of change in the reference current with respect to the change in the drive potential is made relatively small, and as a result, the determination reference that is used when verifying whether or not the memory cell has been properly programmed can be precisely set.

A semiconductor device according to a second aspect of the invention and an electronic apparatus according to a third aspect of the invention include any of the nonvolatile memory device described above. According to the second or third aspect of the invention, a semiconductor device or an electronic apparatus can be provided in which, in the nonvolatile memory device, the determination reference can be precisely set when verifying whether or not a memory cell has been properly programmed to the programmed state in which the threshold voltage of the memory cell is high.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
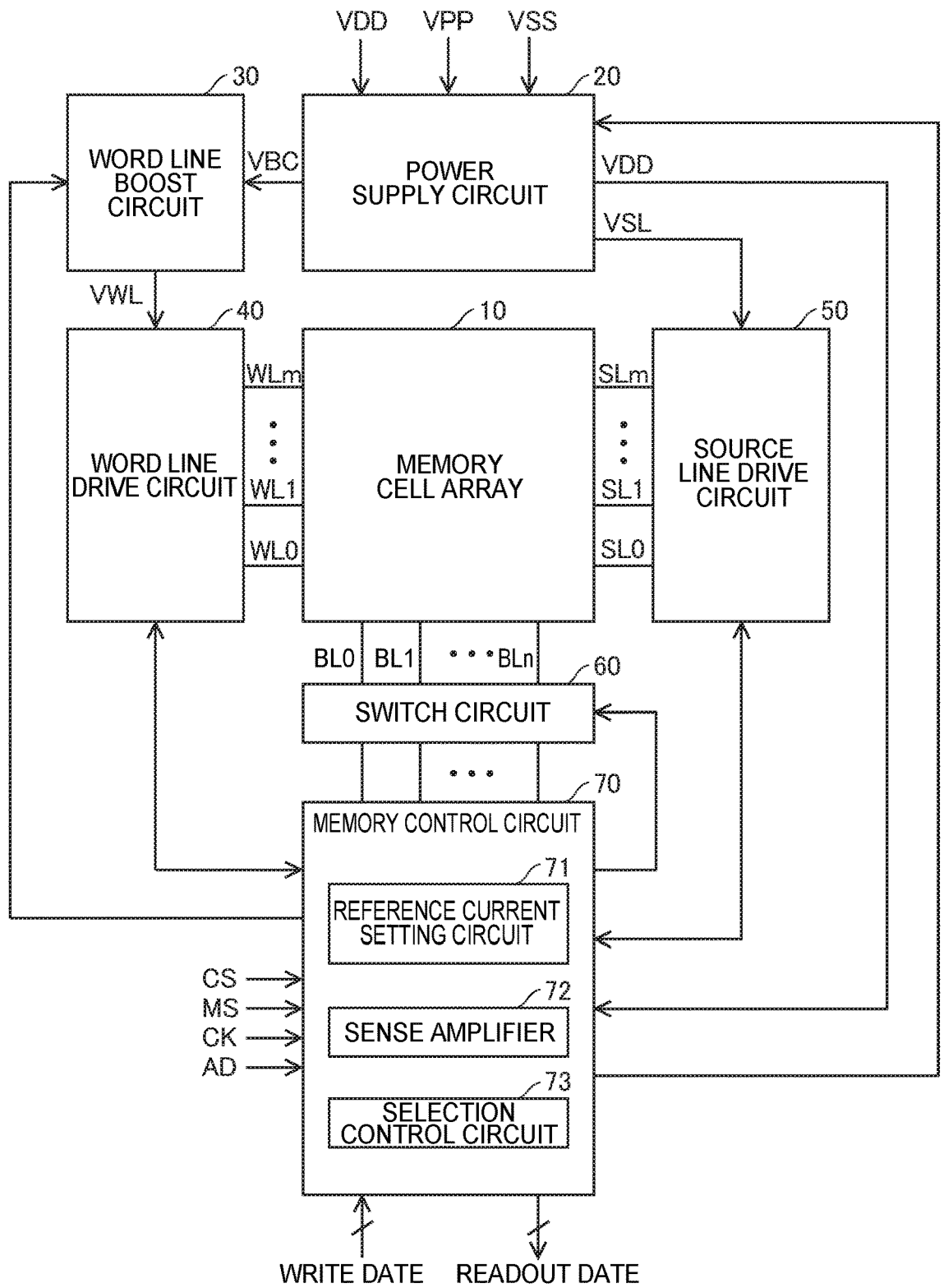
FIG. 1 is a block diagram illustrating an exemplary configuration of a nonvolatile memory device according to one embodiment of the invention.

Hereinafter, embodiments of the invention will be described in detail with reference to the drawings. The same constituent elements are given the same reference numerals, and a redundant description is omitted.

Although the invention can be applied to various types of electrically rewritable nonvolatile memory devices such as a flash memory and an EEPROM, in the following, an embodiment in which the invention is applied to a flash memory will be described as an example.

Overall Configuration of Nonvolatile Memory Device

FIG. 1 is a block diagram illustrating an exemplary configuration of a nonvolatile memory device according to one embodiment of the invention. As shown in FIG. 1, the nonvolatile memory device includes a memory cell array 10, a power supply circuit 20, a word line boost circuit 30, a word line drive circuit 40, a source line drive circuit 50, a switch circuit 60, and a memory control circuit 70.

In the memory cell array 10, a plurality of memory cells are arranged in a matrix of m rows and n columns (m and n are integers of two or more). For example, the memory cell array 10 includes memory cells of 2048 rows. Also, one row of memory cells include 1024 memory cells, and can store 128 pieces of 8-bit data.

Also, the memory cell array 10 includes a plurality of word lines WL0, WL1, . . . , WLm, a plurality of source lines SL0, SL1, . . . , SLm, and a plurality of bit lines BL0, BL1, . . . , BLn. Each word line and the associated source line are connected to a plurality of memory cells that are arranged in the corresponding row. Also, each bit line is connected to a plurality of memory cells arranged in the corresponding column.

The power supply circuit 20 is externally supplied with a logic power supply potential VDD for logic circuits and data readout, a high power supply potential VPP for writing and erasing data, and a reference power supply potential VSS, for example. Alternatively, the power supply circuit 20 may boost or step down an externally supplied power supply potential to generate other power supply potentials.

The reference power supply potential VSS is a reference potential serving as a relative reference for the other potentials, and in the following, a case where the reference power supply potential VSS is the ground potential (0V) will be described. The logic power supply potential VDD is a potential higher than the reference power supply potential VSS, and is about 1.2 V to 1.8 V inclusive, for example. Note that the logic power supply potential VDD may be in common with a power supply potential for a functional circuit that is used along with the nonvolatile memory device. The high power supply potential VPP is a potential higher than the logic power supply potential VDD, and is about 5 V to 10 V inclusive, for example.

The power supply circuit 20 supplies the logic power supply potential VDD to the memory control circuit 70, and supplies the high power supply potential VPP and the logic power supply potential VDD to the units of the nonvolatile memory device as necessary, under the control of the memory control circuit 70. In FIG. 1, a power supply potential that is supplied from the power supply circuit 20 to the word line boost circuit 30 is denoted as a boost circuit power supply potential VBC, and a power supply potential that is supplied from the word line boost circuit 30 to the word line drive circuit 40 is denoted as a word line power supply potential VWL. Also, the power supply potential that is supplied from the power supply circuit 20 to the source line drive circuit 50 is denoted as a source line power supply potential VSL.

For example, in a write mode in which data is to be written into a memory cell and in an erase mode in which a memory cell is to be erased, the power supply circuit 20 supplies the high power supply potential VPP to the word line boost circuit 30 and the source line drive circuit 50. The word line boost circuit 30 supplies the high power supply potential VPP to the word line drive circuit 40.

Also, in a readout mode in which data is to be read out from a memory cell and in a verify mode in which whether or not data is properly written into a memory cell is verified, the power supply circuit 20 supplies the logic power supply potential VDD to the word line boost circuit 30 and the source line drive circuit 50. In the readout mode, the word line boost circuit 30 boosts the logic power supply potential VDD so as to generate a boosted word line potential VUP (2.8 V, for example), and supplies the boosted word line potential VUP to the word line drive circuit 40. In the verify mode, the word line boost circuit 30 supplies the logic power supply potential VDD or the boosted word line potential VUP to the word line drive circuit 40.

The word line drive circuit 40 is connected to the plurality of word lines WL0, WL1, . . . , WLm, and drives the word line connected to the memory cells selected by the memory control circuit 70. The source line drive circuit 50 is connected to the plurality of source lines SL1, SL2, . . . , SLm, and drives the source line connected to the memory cells selected by the memory control circuit 70.

The switch circuit 60 includes a plurality of N-channel MOS transistors respectively connected to the plurality of bit lines BL0, BL1, . . . , BLn, for example, and these transistors are each turned on or off, under the control of the memory control circuit 70. The memory control circuit 70 can be connected to the memory cells connected to the plurality of bit lines BL0, BL1, . . . , BLn via the switch circuit 60.

The memory control circuit 70 controls the circuits ranging from the power supply circuit 20 to the switch circuit 60 such that a write operation, a readout operation, a verify operation, or an erase operation is performed on the plurality of memory cells included in the memory cell array 10. For example, the memory control circuit 70 is constituted by a logic circuit, an analog circuit, and the like, and includes a reference current setting circuit 71, a sense amplifier 72, and a selection control circuit 73.

The reference current setting circuit 71 sets a reference current using a selected reference cell in the readout mode and the verify mode. The sense amplifier 72 reads out data stored in a memory cell by comparing the current flowing through the memory cell with the reference current. The selection control circuit 73 is a control circuit that controls the selection of the reference cell in the reference current setting circuit 71.

The memory control circuit 70 is supplied with a chip select signal CS, a mode select signal MS, a clock signal CK, and an address signal AD. The memory control circuit 70, when the nonvolatile memory device is selected in accordance with the chip select signal CS, sets the nonvolatile memory device to the write mode, the readout mode, the verify mode, or the erase mode, in accordance with the mode select signal MS.

In the write mode, the memory control circuit 70 receives an input of write data in synchronization with the clock signal CK, and controls the units of the nonvolatile memory device such that the data is written into the memory cell designated by the address signal AD. Also, in the readout mode and the verify mode, the memory control circuit 70 controls the units of the nonvolatile memory device such that the data is read out from the memory cell designated by the address signal AD, and outputs the readout data in synchronization with the clock signal CK.

Memory Cell Array

Figure 2:
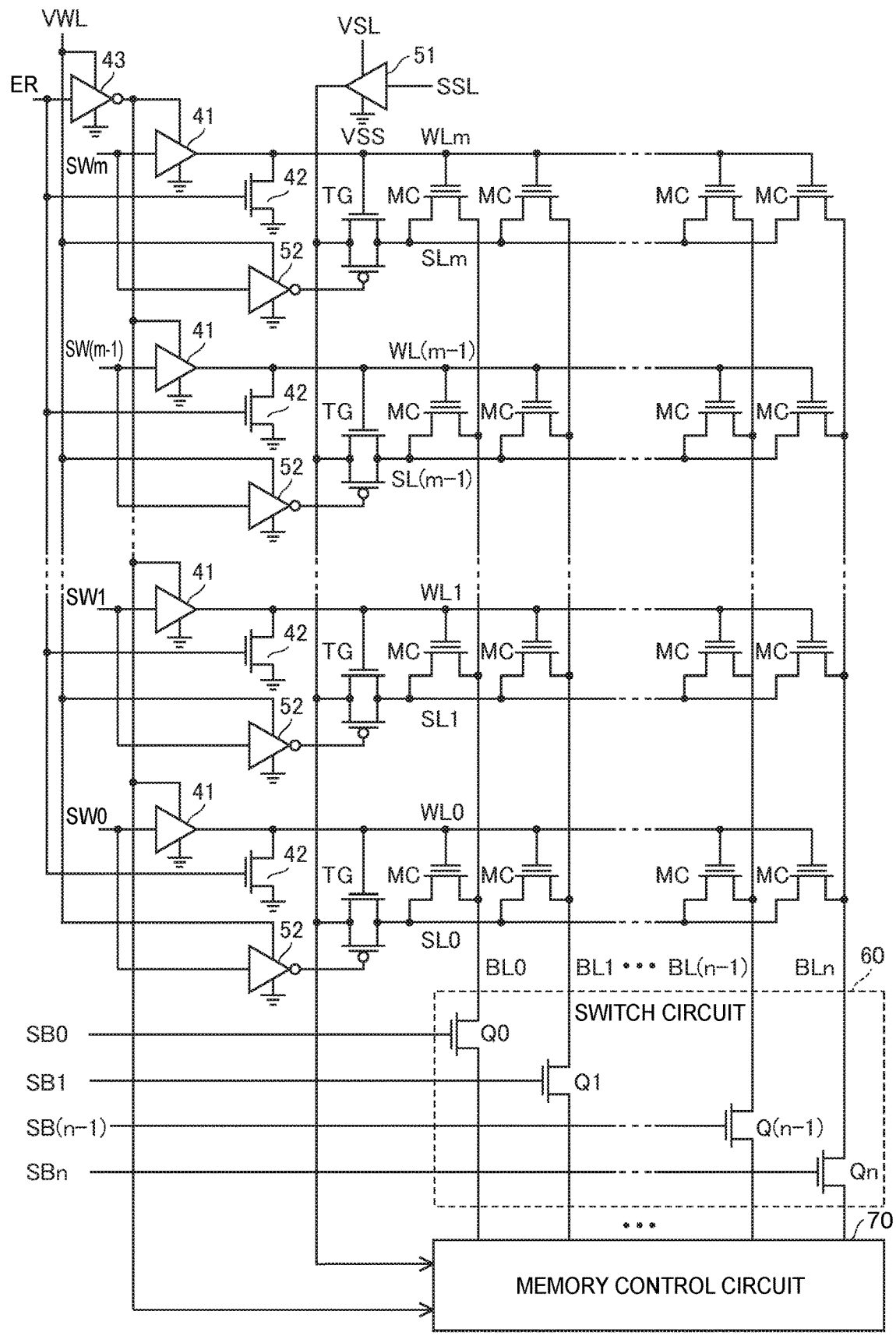
FIG. 2 is a circuit diagram illustrating an exemplary configuration of a memory cell array and a surrounding region thereof shown in FIG. 1.

FIG. 2 is a circuit diagram illustrating an exemplary configuration of the memory cell array and a surrounding region thereof shown in FIG. 1. Each memory cell MC is constituted by an N-channel MOS transistor that has a control gate, a floating gate, a source, and a drain, for example. The transistor of the memory cell MC stores 1-bit data utilizing charges accumulated in the floating gate.

Each of the word lines WL0 to WLm is connected to the control gates of the transistors of the plurality of memory cells MC that are arranged in the corresponding row. Each of the source lines SL0 to SLm is connected to the sources of the transistors of the plurality of memory cells MC that are arranged in the corresponding row. Also, each of the bit lines BL0 to BLn is connected to the drains of the transistors of the plurality of memory cells MC that are arranged in the corresponding column.

The word line drive circuit 40 (FIG. 1) includes a plurality of word line drivers 41 that are respectively connected to the word lines WL0 to WLm so as to drive the control gates of the transistors of the memory cells MC connected to the word lines WL0 to WLm, a plurality of N-channel MOS transistors 42, and an inverter 43. The word line driver 41 is constituted by a level shifter, a buffer circuit, an inverter, or the like, for example.

The word line power supply potential VWL is supplied to the inverter 43 from the power supply circuit 20 (FIG. 1). An erase mode signal ER that is activated to a high level in the erase mode is applied to an input terminal of the inverter 43 from the memory control circuit 70. When the erase mode signal ER is deactivated to a low level, the inverter 43 supplies the word line power supply potential VWL to the plurality of word line drivers 41.

Word line selection signals SW0 to SWm, which are activated to a high level when one or a plurality of rows of memory cells from the plurality of memory cells that constitute the memory cell array are selected, are respectively input to input terminals of the plurality of word line drivers 41 from the memory control circuit 70. Each word line driver 41 outputs the word line power supply potential VWL to the word line when the word line selection signal is activated to a high level, and outputs the reference power supply potential VSS to the word line when the word line selection signal is deactivated to a low level.

The source line drive circuit 50 (FIG. 1) includes a source line driver 51, a plurality of transmission gates TG, and a plurality of inverters 52 in order to drive the sources of the transistors of the memory cells MC connected to the source lines SL0 to SLm. The source line driver 51 is constituted by a level shifter, a buffer circuit, an inverter, or the like, for example. The plurality of transmission gates TG are connected between an output terminal of the source line driver 51 and the respective source lines SL0 to SLm.

The source line power supply potential VSL is supplied to the source line driver 51 from the power supply circuit 20 (FIG. 1). A source line drive signal SSL that is activated to a high level when a high power supply potential is supplied to the source lines is input to an input terminal of the source line driver 51 from the memory control circuit 70. The source line driver 51 outputs the source line power supply potential VSL when the source line drive signal SSL is activated to a high level, and outputs the reference power supply potential VSS when the source line drive signal SSL is deactivated to a low level.

Each transmission gate TG is constituted by an N-channel MOS transistor and a P-channel MOS transistor, and functions as a switch circuit that opens and closes the connection between the output terminal of the source line driver 51 and the corresponding source line. In each transmission gate TG, a gate of the N-channel MOS transistor is connected to the output terminal of the word line driver 41, and a gate of the P-channel MOS transistor is connected to an output terminal of the inverter 52.

The word line power supply potential VWL is supplied to each inverter 52 from the word line drive circuit 40 (FIG. 1). The word line selection signals SW0 to SWm are respectively input to input terminals of the inverters 52 from the memory control circuit 70. The plurality of inverters 52 respectively invert the word line selection signals SW0 to SWm, and apply the inverted word line selection signals SW0 to SWm to the respective gates of the P-channel MOS transistors of the transmission gates TG.

The switch circuit 60 includes N-channel MOS transistors Q0 to Qn that are connected between the respective bit lines BL0 to BLn and the memory control circuit 70. Bit line selection signals SB0 to SBn that are activated to a high level when one or a plurality of columns of memory cells are selected from the plurality of memory cells that constitute the memory cell array are respectively input to gates of the transistors Q0 to Qn from the memory control circuit 70.

In the write mode, the memory control circuit 70, in order to select the word line and the bit line that are connected to the memory cell MC designated by the address signal, activates the corresponding word line selection signal and bit line selection signal to a high level, and deactivates the other word line selection signals and bit line selection signals to a low level, and activates the source line drive signal SSL to a high level. In the following, a case where the word line WL0 and the bit line BL0 are to be selected will be described, as an example.

The high power supply potential VPP is supplied to the inverter 43, the source line driver 51, and the inverters 52. The inverter 43 to which the erase mode signal ER that is deactivated to a low level is input supplies the high power supply potential VPP to the plurality of word line drivers 41. The word line driver 41 to which the word line selection signal SW0 that is activated to a high level is input outputs the high power supply potential VPP to the word line WL0. The source line driver 51 to which the source line drive signal SSL that is activated to a high level is input outputs the high power supply potential VPP.

The high power supply potential VPP is applied to the gate of the N-channel MOS transistor of the transmission gate TG connected to the word line WL0. Also, the inverter 52 to which the word line selection signal SW0 that is activated to a high level is input inverts the word line selection signal SW0, and applies the reference power supply potential VSS to the gate of the P-channel MOS transistor of the transmission gate TG. Accordingly, the transmission gate TG connected to the word line WL0 is turned on, and the high power supply potential VPP output from the source line driver 51 is output to the source line SL0.

Also, the transistor Q0 of the switch circuit 60 to which the bit line selection signal SB0 that is activated to a high level is input is turned on, and the memory control circuit 70 outputs the reference power supply potential VSS to the bit line BL0. In this way, the memory control circuit 70 controls the word line drive circuit 40 (FIG. 1) and the source line drive circuit 50 (FIG. 1) such that the high power supply potential VPP is applied to the control gate and source of the transistor of the memory cell MC that is designated by the address signal, and applies the reference power supply potential VSS to the drain.

As a result, a current flows from the source to the drain of the transistor of the memory cell MC designated by the address signal. Hot carriers (electrons, in the present embodiment) generated due to the flowing current are injected into the floating gate, negative charges are accumulated in the floating gate, and as a result, the threshold voltage of the transistor increases.

On the other hand, the word line drivers 41 to which the word line selection signals SW1 to SWm that are deactivated to a low level are respectively input output the reference power supply potential VSS to the word lines WL1 to WLm. The reference power supply potential VSS is applied to the gates of the N-channel MOS transistors of the transmission gates TG connected to the word lines WL1 to WLm. Also, the plurality of inverters 52 to which the word line selection signals SW1 to SWm that are deactivated to a low level are respectively input invert the respective word line selection signals SW1 to SWm, and apply the high power supply potential VPP to the gates of the P-channel MOS transistors of the transmission gates TG. Accordingly, the transmission gates TG that are connected to the word lines WL1 to WLm are turned off.

Also, the transistors Q1 to Qn of the switch circuit 60 to which the bit line selection signals SB1 to SBn that are deactivated to a low level are respectively input are turned off. As a result, a current does not flow between the source and drain of the transistor of each of the memory cells MC that are not designated by the address signal, and therefore the threshold voltage of each of the transistors does not change.

In the erase mode, the memory control circuit 70, in order to select the word line connected to the memory cell MC designated by the address signal, activates the corresponding word line selection signal to a high level, and deactivates the other word line selection signals to a low level, and deactivates the bit line selection signals SB0 to SBn to a low level and activates the source line drive signal SSL to a high level. In the following, a case where the word line WL0 is to be selected will be described, as an example.

The high power supply potential VPP is supplied to the inverter 43, the source line driver 51, and the inverters 52. The inverter 43 to which the erase mode signal ER that is activated to a high level is input supplies the reference power supply potential VSS to the plurality of word line drivers 41 so as to stop operations.

The plurality of N-channel MOS transistors 42 to whose gates the erase mode signal ER that is activated to a high level is applied are turned on, and supplies the reference power supply potential VSS to the word lines WL0 to WLm. Also, the source line driver 51 to which the source line drive signal SSL that is activated to a high level is input outputs the high power supply potential VPP.

The inverter 52 to which the word line selection signal SW0 that is activated to a high level is input inverts the word line selection signal SW0, and applies the reference power supply potential VSS to the gate of the P-channel MOS transistor of the transmission gate TG. Accordingly, the transmission gate TG that is connected to the word line WL0 is turned on, and outputs the high power supply potential VPP output from the source line driver 51 to the source line SL0.

Also, the transistors Q0 to Qn of the switch circuit 60 to which the bit line selection signals SB0 to SBn that are deactivated to a low level are respectively input are turned off. In this way, the memory control circuit 70 controls the word line drive circuit 40 (FIG. 1) such that the drains of the transistors of the plurality of memory cells MC are in an open state (high impedance state), and the reference power supply potential VSS is applied to the control gates, and controls the source line drive circuit 50 (FIG. 1) such that the high power supply potential VPP is applied to the sources of the transistors of the memory cells MC connected to the word line WL0. As a result, if negative charges are accumulated in the floating gate of the transistor of a memory cell MC connected to the word line WL0, the negative charges accumulated in the floating gate are discharged to the source, and the threshold voltage of the transistor decreases.

On the other hand, the plurality of inverters 52, to which the word line selection signals SW1 to SWm that are deactivated to a low level are respectively input, invert the word line selection signals SW1 to SWm, and apply the high power supply potential VPP to the gates of the P-channel MOS transistors of the transmission gates TG. Accordingly, the transmission gates TG connected to the word lines WL1 to WLm are turned off. As a result, negative charges that are accumulated in the floating gate of the transistor of each of the memory cells MC connected to the word lines WL1 to WLm are not discharged, and therefore the threshold voltage of each transistor does not change.

In the readout mode, in order to select the word line and bit line connected to the memory cell MC designated by the address signal, the memory control circuit 70 activates the corresponding word line selection signal and bit line selection signal to a high level, and deactivates the other word line selection signals and bit line selection signals to a low level, and deactivates the source line drive signal SSL to a low level. In the following, a case where the word line WL0 and the bit line BL0 are to be selected will be described, as an example.

The boosted word line potential VUP is supplied to the inverters 43 and 52, and the logic power supply potential VDD is supplied to the source line driver 51. The inverter 43, to which the erase mode signal ER that is deactivated to a low level is input, supplies the boosted word line potential VUP to the plurality of word line drivers 41. The word line driver 41, to which the word line selection signal SW0 that is activated to a high level is input, outputs the boosted word line potential VUP to the word line WL0. Also, the source line driver 51, to which the source line drive signal SSL that is deactivated to a low level is input, outputs the reference power supply potential VSS.

The boosted word line potential VUP is applied to the gate of the N-channel MOS transistor of the transmission gate TG that is connected to the word line WL0. Also, the inverter 52, to which the word line selection signal SW0 that is activated to a high level is input, inverts the word line selection signal SW0, and applies the reference power supply potential VSS to the gates of the P-channel MOS transistor of the transmission gate TG. Accordingly, the transmission gate TG connected to the word line WL0 is turned on, and outputs the reference power supply potential VSS that is output from the source line driver 51 to the source line SL0.

Also, the transistor Q0 of the switch circuit 60, to which the bit line selection signal SB0 that is activated to a high level is input, is turned on, and the memory control circuit 70 outputs a potential at a high level to the bit line BL0. In this way, the memory control circuit 70 controls the word line drive circuit 40 (FIG. 1) such that the boosted word line potential VUP is applied to the control gate of the transistor of the memory cell MC designated by the address signal, and controls the source line drive circuit 50 (FIG. 1) such that the reference power supply potential VSS is supplied to the source, and supplies the potential at a high level to the drain.

As a result, a drain current flows from the drain to the source of the transistor of the memory cell MC designated by the address signal. The magnitude of the drain current differs depending on the amount of negative charges accumulated in the floating gate, and as a result, the memory control circuit 70 can read out data from the memory cell MC based on the magnitude of the drain current.

Note that, in the verify mode, the logic power supply potential VDD, instead of the boosted word line potential VUP, may be supplied to the inverters 43 and 52.

Memory Control Circuit 1

Figure 3:
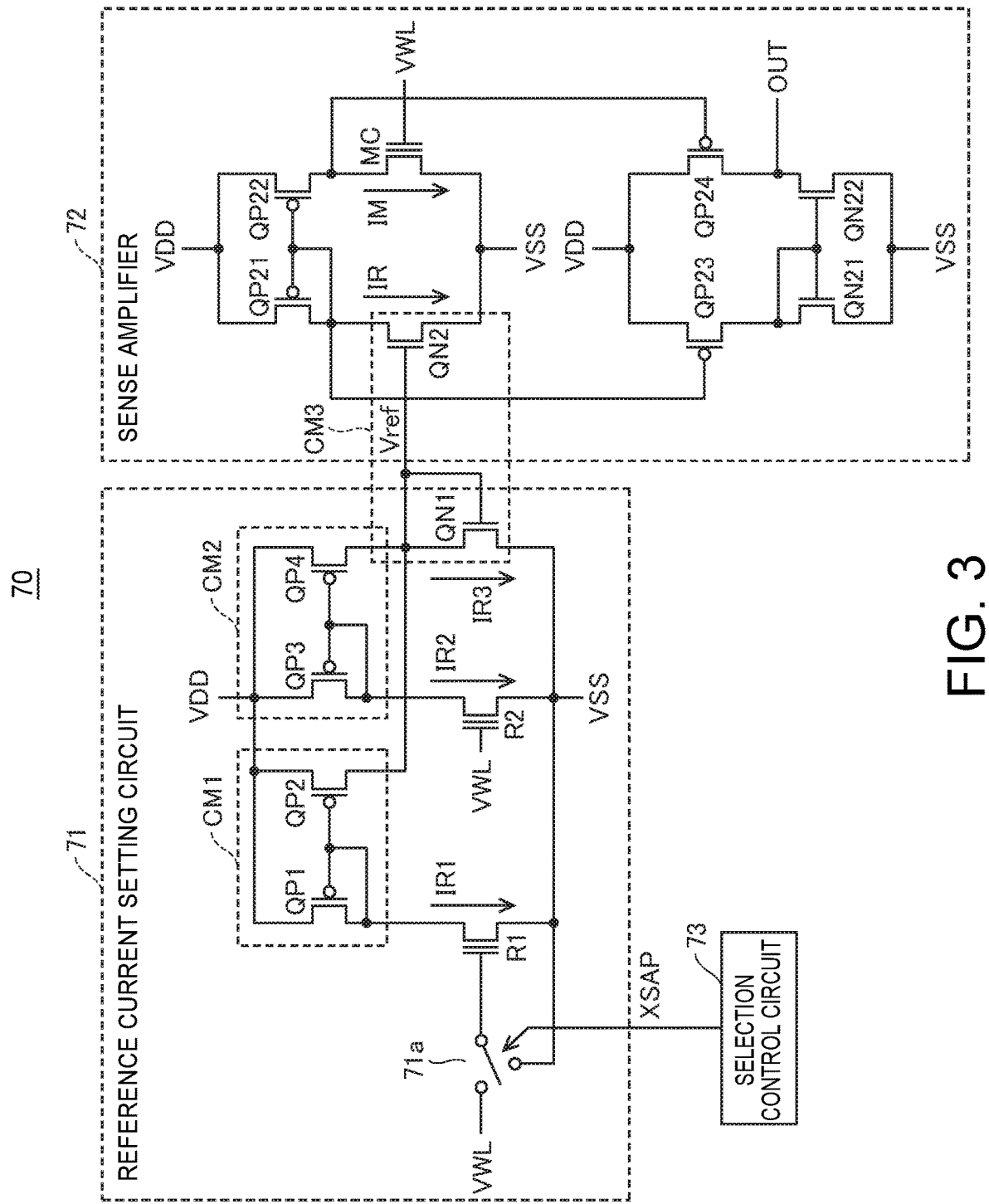
FIG. 3 is a circuit diagram illustrating a first exemplary configuration of a memory control circuit shown in FIG. 1.

FIG. 3 is a circuit diagram illustrating a first exemplary configuration of the memory control circuit 70 shown in FIG. 1. The reference current setting circuit 71, the sense amplifier 72, and the selection control circuit 73 are illustrated in FIG. 3.

A word line power supply potential (also referred to as a "drive potential") VWL is applied to the control gate of the transistor of the memory cell MC designated by the address signal from the word line drive circuit 40 (FIG. 1), and the reference power supply potential VSS is supplied to the source. With this, a current IM flows through the memory cell MC designated by the address signal depending on the stored data.

The reference current setting circuit 71 includes a first reference cell R1, a second reference cell R2, a first current mirror circuit CM1, a second current mirror circuit CM2, a selection circuit 71a, and an N-channel MOS transistor QN1 (first transistor).

The first reference cell R1 and the second reference cell R2 are each constituted by an N-channel MOS transistor with a control gate, a floating gate, a source, and a drain, similarly to the memory cell MC. The first reference cell R1 is set in an intermediate state between the erased state and the programmed (written) state, or in the programmed state. On the other hand, the second reference cell R2 is set to the erased state.

Here, the intermediate state between the erased state and the programmed state refers to a memory state in which, when the same drive potential is applied to a cell, the current I that flows through the cell is smaller than the current $I_E$ that flows through the erased state-memory cell, and is larger than the current $I_P$ that flows through the programmed state-memory cell.

$$I_P < I < I_E \quad (1)$$

That is, if the sizes of transistors that constitute a plurality of types of cells are the same, the transistor of a cell in the intermediate state has a higher threshold voltage than the transistor of an erased state-memory cell, and has a lower threshold voltage than the transistor of a programmed state-memory cell.

As shown in the expression (1), the current I may not strictly be of the intermediate value between the current $I_E$ and the current $I_P$. However, considering a shift and the like in the current value due to temperature characteristics of the current mirror circuit, in order to provide a margin with respect to the erased state and the programmed state, it is desirable that the intermediate state is set as shown in expression (2), and it is further desirable that the intermediate state is set as shown in expression (3).

$$1.1 \times I_P \leq I \leq 0.9 \times I_E \quad (2)$$

$$1.2 \times I_P \leq I \leq 0.8 \times I_E \quad (3)$$

The transistors of the first reference cell R1 and the second reference cell R2 have respective sources to which the reference power supply potential VSS is supplied, and when a potential at a high level is supplied to the drains, currents IR1 and IR2 flow through the respective transistors according to the drive potential VWL applied to the control gates.

The first current mirror circuit CM1 generates, in a selected state of the first reference cell R1, a first mirror current that is proportional to the current IR1 flowing through the first reference cell R1. In the example shown in FIG. 3, the first current mirror circuit CM1 includes P-channel MOS transistors QP1 and QP2.

The transistor QP1 has a source supplied with the logic power supply potential VDD, and a gate and a drain that are connected to the drain of the transistor of the first reference cell R1. The transistor QP2 has a source supplied with the logic power supply potential VDD and a gate connected to the gate and drain of the transistor QP1.

The second current mirror circuit CM2 generates, in a selected state of the second reference cell R2, a second mirror current that is proportional to the current IR2 flowing through the second reference cell R2. In the example shown in FIG. 3, the second reference cell R2 is always in the selected state in the readout mode and the verify mode. Also, the second current mirror circuit CM2 includes P-channel MOS transistors QP3 and QP4.

The transistor QP3 has a source supplied with the logic power supply potential VDD, and a gate and a drain that are connected to the drain of the transistor of the second reference cell R2. The transistor QP4 has a source supplied with the logic power supply potential VDD and a gate connected to the gate and drain of the transistor QP3.

The transistor QN1 has a drain and a gate that are connected to a drain of the transistor QP2 in the first current mirror circuit CM1 and a drain of the transistor QP4 in the second current mirror circuit CM2, and a source supplied with the reference power supply potential VSS. The first mirror current or the second mirror current flows through the transistor QN1 as a current IR3, and a reference potential Vref is generated at the drain and gate of the transistor QN1.

The sense amplifier 72 includes an N-channel MOS transistor QN2 (second transistor) that constitutes a third current mirror circuit CM3 together with the transistor QN1, and the transistor QN2 allows a reference current IR proportional to the current IR3 flowing through the transistor QN1 to flow. Accordingly, even if a current is amplified by the first current mirror circuit CM1 and the second current mirror circuit CM2 in order to drive the load, the magnitude of the reference current IR can be appropriately set by the third current mirror circuit CM3.

The transistor QN2 has a gate connected to the drain and gate of the transistor QN1, and a source supplied with the reference power supply potential VSS. Also, the sense amplifier 72 further includes P-channel MOS transistors QP21 to QP24 and N-channel MOS transistors QN21 and QN22.

The transistor QP21 has a source supplied with the logic power supply potential VDD, and a gate and a drain that are connected to the drain of the transistor QN2. The transistor QP22 has a source supplied with the logic power supply potential VDD, a gate connected to the gate and drain of the transistor QP21, and a drain to be connected to the drain of the transistor of a memory cell MC. Here, the transistors QP21 and QP22 constitute a current mirror circuit.

The transistor QP23 has a source supplied with the logic power supply potential VDD, and a gate connected to the drain of the transistor QN2. The transistor QP24 has a source supplied with the logic power supply potential VDD, and a gate to be connected to the drain of the transistor of the memory cell MC. Here, the transistors QP23 and QP24 constitute the differential pair of a differential amplifier.

The transistor QN21 has a drain and a gate that are connected to a drain of the transistor QP23 and a source supplied with the reference power supply potential VSS. The transistor QN22 has a drain connected to a drain of the transistor QP24, a gate connected to the drain and gate of the transistor QN21, and a source supplied with the reference power supply potential VSS. Here, the transistors QN21 and QN22 constitute a current mirror circuit. An output signal OUT of the sense amplifier 72 is generated at a connection point between the transistor QP24 and the transistor QN22.

The sense amplifier 72 reads out data stored in the memory cell MC by comparing the current IM flowing through the memory cell MC with the reference current IR. For example, the sense amplifier 72, when the current IM flowing through the memory cell MC is larger than the reference current IR, brings the output signal OUT to a high level, and when the current IM flowing through the memory cell MC is smaller than the reference current IR, brings the output signal OUT to a low level.

The selection circuit 71a sets the selection state of the first reference cell R1 and the second reference cell R2 such that the reference current IR is generated based on at least the first mirror current in the readout mode, and the reference current IR is generated based on the second mirror current in the verify mode.

In the example shown in FIG. 3, the selection circuit 71a is connected between the word line drive circuit 40 (FIG. 1) and the control gate of the transistor of the first reference cell R1. Alternatively, the selection circuit 71a may be connected between an interconnect of the logic power supply potential VDD and the source of the transistor QP1 or QP2, connected between the drain of the transistor QP1 and the drain of the transistor of the first reference cell R1, or connected between the drain of the transistor QP2 and the drain of the transistor QN1.

In such cases, the selection circuit 71a sets the state of connection between the first reference cell R1 and the first current mirror circuit CM1 or the connection state of the first current mirror circuit CM1 such that the first mirror current is generated in the readout mode, and the first mirror current is not generated in the verify mode. With this, the first reference cell R1 can be set to a selected or unselected state.

For example, the selection circuit 71a is constituted by a plurality of analog switches or the like, selects one of the drive potential VWL and the reference power supply potential VSS in accordance with a control signal XSAP supplied from the selection control circuit 73, and applies the selected potential to the control gate of the transistor of the first reference cell R1.

In the readout mode, as a result of the selection control circuit 73 activating the control signal XSAP to a low level, the selection circuit 71a applies the drive potential VWL to the control gate of the transistor of the first reference cell R1. Accordingly, a current IR1 flows through the first reference cell R1, a first mirror current flows in the first current mirror circuit CM1, and a reference current IR is generated based on the first mirror current and the second mirror current. Accordingly, even in a low voltage state in which a current does not flow through the first reference cell R1, the reference current IR can be generated using the second reference cell R2.

In the verify mode, as a result of the selection control circuit 73 deactivating the control signal XSAP to a high level, the selection circuit 71a applies the reference power supply potential VSS to the control gate of the transistor of the first reference cell R1. Accordingly, because there is no current flowing through the first reference cell R1 and in the first current mirror circuit CM1, the reference current IR is generated based on the second mirror current.

The first current mirror circuit CM1 generates the first mirror current having a magnitude that is a times the current IR1 flowing through the first reference cell R1. Also, the second current mirror circuit CM2 generates the second mirror current having a magnitude that is b times the current IR2 flowing through the second reference cell R2. Furthermore, the third current mirror circuit CM3 generates the reference current IR having a magnitude that is c times the first mirror current and the second mirror current.

Here, assuming that ac=1, and 0<bc<1, the third current mirror circuit CM3 generates a current having a magnitude that is approximately the same as the current IR1 flowing through the first reference cell R1 based on the first mirror current, and generates a current having a magnitude that is $\beta$ times (0<$\beta$<1) the current IR2 flowing through the second reference cell R2 based on the second mirror current. In the case where a=8, b=4, and c=⅛, $\beta$=½, for example. Alternatively, the setting is such that 0.2≤$\beta$≤0.6.

Accordingly, in the readout mode, the amount of change in the reference current IR with respect to the change in the drive potential VWL can approximate the amount of change in a current IR1 flowing through the first reference cell R1, and the influence of the change in temperature and power supply voltage can be reduced. Also, in the verify mode, the amount of change in the reference current IR with respect to the change in the drive potential VWL can be made relatively small, and the determination reference can be precisely set when verifying whether or not the memory cell MC is properly programmed.

Figure 4:
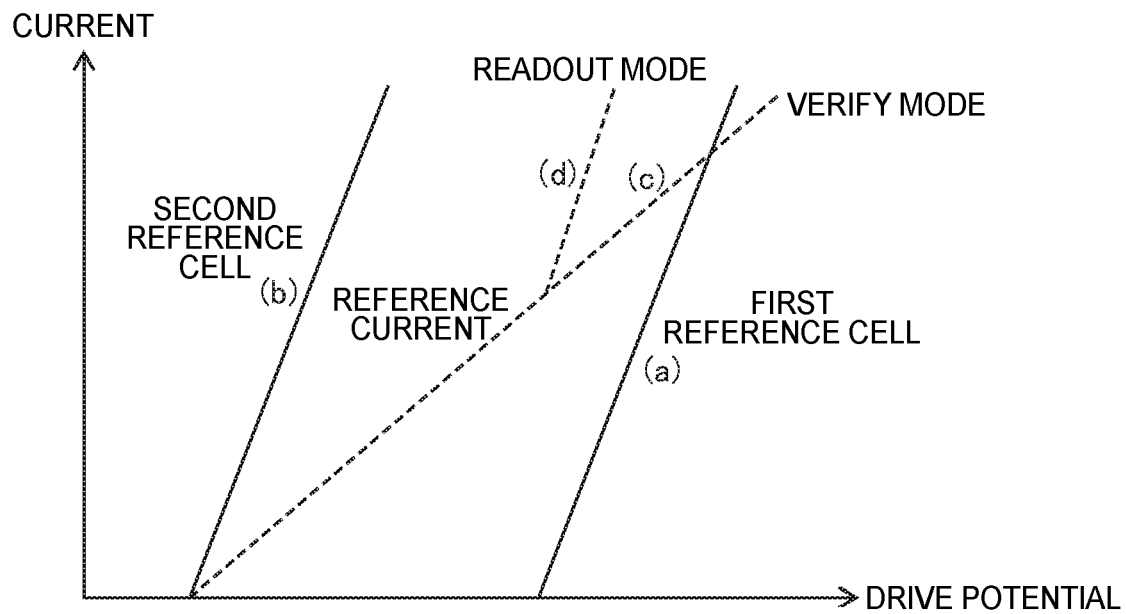
FIG. 4 is a diagram illustrating an exemplary setting of a reference current set by a reference current setting circuit.

FIG. 4 is a diagram illustrating an exemplary setting of the reference current set by the reference current setting circuit 71 shown in FIG. 3. In FIG. 4, the horizontal axis shows the drive potential applied to the first reference cell R1 and the second reference cell R2, and the vertical axis shows the current flowing according to the drive potential. Also, the solid line (a) shows the current flowing through the first reference cell R1, and the solid line (b) shows the current flowing through the second reference cell R2.

In the verify mode, a reference current IR shown by the broken line (c) having a magnitude of approximately one third of the current IR2 flowing through the second reference cell R2 in the erased state can be obtained by the second current mirror circuit CM2 and the third current mirror circuit CM3, for example. In this way, as a result of making the amount of change in the reference current IR with respect to the change in the drive potential relatively small, the determination reference that is used when verifying whether or not a memory cell MC has been properly programmed can be precisely set.

On the other hand, in the readout mode, a reference current IR shown by the broken line (d) can be obtained by adding a current having a magnitude approximately the same as the current IR1 flowing through the first reference cell R1 in the intermediate state between the erased state and the programmed state or in the programmed state and a current having a magnitude of approximately one third of the current IR2 flowing through the erased state-second reference cell R2, for example. As a result of the amount of change in the reference current IR with respect to the change in the drive potential approximating the amount of change in the current flowing through the first reference cell R1, the influence of a change in temperature or the power supply voltage can be reduced.

Furthermore, in the verify mode, different reference currents IR may be used in an erase verify in which it is determined whether or not a memory cell MC is properly erased, and in a program verify in which it is determined whether or not a memory cell MC is properly programmed. Accordingly, the determination reference can be more precisely set, and the reliability of data stored in the memory cell MC can be improved.

For example, the reference current may be generated, when the erase verify is performed, by obtaining a current that has a magnitude that is approximately half of the current flowing through the second reference cell R2, using the second current mirror circuit CM2 and the third current mirror circuit CM3, and when the program verify is performed, by obtaining a current that has a magnitude approximately one third of the current flowing through the second reference cell R2, using the second current mirror circuit CM2 and the third current mirror circuit CM3.

According to the first exemplary configuration, in the verify mode, the reference current IR is generated based on the second mirror current proportional to the current flowing through the erased state-second reference cell R2 whose threshold voltage is low, and as a result, the reference current IR that moderately changes relative to that in the readout mode with respect to the change in the drive potential VWL applied to the cell can be generated. Accordingly, the determination reference can be precisely set when verifying whether or not a memory cell MC has been properly programmed to a programmed state in which the threshold voltage of the memory cell is high.

Memory Control Circuit 2

Figure 5:
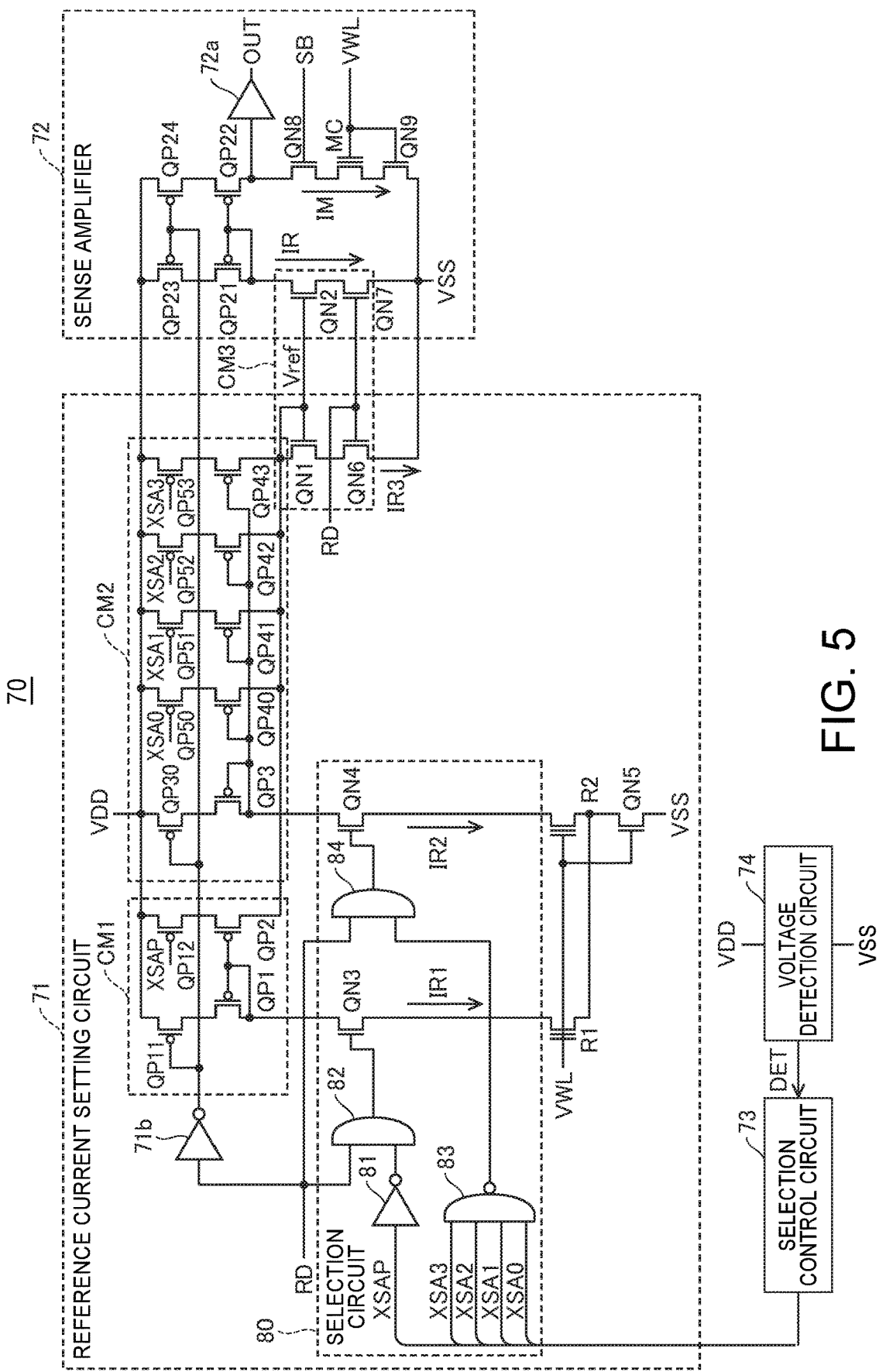
FIG. 5 is a circuit diagram illustrating a second exemplary configuration of the memory control circuit shown in FIG. 1.

FIG. 5 is a circuit diagram illustrating a second exemplary configuration of the memory control circuit 70 shown in FIG. 1. In the second exemplary configuration, a selection circuit 80 is provided in place of the selection circuit 71a in the first exemplary configuration shown in FIG. 3, and the configurations of other circuits are changed as well. Accordingly, it is possible to set selection/unselection of the second reference cell R2 in addition to the selection/unselection of the first reference cell R1, and to change the mirror ratio of the second current mirror circuit CM2 as well. In other respects, the second exemplary configuration may be similar to the first exemplary configuration.

As shown in FIG. 5, the reference current setting circuit 71 includes the first reference cell R1 in the intermediate state between the erased state and the programmed state, or in the programmed state, and the second reference cell R2 in the erased state, the first current mirror circuit CM1, the second current mirror circuit CM2, an inverter 71b, the selection circuit 80, and N-channel MOS transistors QN1, QN5, and QN6.

The memory control circuit 70 activates the control signal RD to a high level in the readout mode and the verify mode. The inverter 71b inverts the control signal RD, and supplies the inverted control signal RD to the first current mirror circuit CM1, the second current mirror circuit CM2, and the sense amplifier 72.

The selection control circuit 73 activates a control signal XSAP to a low level when the first reference cell R1 is to be selected, and activates at least one of control signals XSA0 to XSA3 to a low level in accordance with the setting of the mirror ratio of the second current mirror circuit CM when the second reference cell R2 is to be selected.

In the first current mirror circuit CM1, P-channel MOS transistors QP11 and QP12 are added in addition to the transistors QP1 and QP2 shown in FIG. 3. The transistor QP11 is connected between an interconnect of the logic power supply potential VDD and the transistor QP1, and is turned on when the control signal RD is activated to a high level. The transistor QP12 is connected between the interconnect of the logic power supply potential VDD and the transistor QP2, and is turned on when the control signal XSAP is activated to a low level.

In the second current mirror circuit CM2, P-channel MOS transistors QP40 to QP43 are provided in place of the transistor QP4 shown in FIG. 3, and transistors QP30, and QP50 to QP53 are added. The transistor QP30 is connected between the interconnect of the logic power supply potential VDD and the transistor QP3, and is turned on when the control signal RD is activated to a high level.

The transistor QP50 is connected between the interconnect of the logic power supply potential VDD and the transistor QP40, and is turned on when the control signal XSA0 is activated to a low level. The transistor QP51 is connected between the interconnect of the logic power supply potential VDD and the transistor QP41, and is turned on when the control signal XSA1 is activated to a low level.

The transistor QP52 is connected between the interconnect of the logic power supply potential VDD and the transistor QP42, and is turned on when the control signal XSA2 is activated to a low level. The transistor QP53 is connected between the interconnect of the logic power supply potential VDD and the transistor QP43, and is turned on when the control signal XSA3 is activated to a low level.

When at least one of the transistors QP50 to QP53 is turned on, at least one of the corresponding transistors QP40 to QP43 constitutes a current mirror circuit together with the transistor QP3. Accordingly, the second current mirror circuit CM2 is configured to be able to change the mirror ratio using the control signals XSA0 to XSA3.

With this, the determination reference in the verify mode can be set by changing the reference current IR with a simple configuration without increasing the number of reference cells and adjusting the drive potential of a reference cell. In the example shown in FIG. 5, the mirror ratio of the second current mirror circuit CM2 can be changed in 16 ways based on which of the transistors QP50 and QP53 is turned on.

The selection circuit 80 includes an inverter 81, AND circuits 82 and 84, a NAND circuit 83, and N-channel MOS transistors QN3 and QN4. The transistor QN3 has a drain that is connected to the drain of the transistor QP1 in the first current mirror circuit CM1, and a source that is connected to the drain of the transistor of the first reference cell R1. The transistor QN4 has a drain that is connected to the drain of the transistor QP3 in the second current mirror circuit CM2, and a source that is connected to the drain of the transistor of the second reference cell R2.

The inverter 81 inverts the control signal XSAP, and applies the inverted control signal XSAP to the AND circuit 82. The AND circuit 82 applies an output signal at a high level to a gate of the transistor QN3 when the control signal RD is activated to a high level and the control signal XSAP is activated to a low level. With this, the transistor QN3 is turned on, and a potential at a high level is applied to the drain of the transistor of the first reference cell R1.

The NAND circuit 83 applies an output signal at a high level to the AND circuit 84 when at least one of the control signals XSA0 to XSA3 is activated to a low level. The AND circuit 84 applies an output signal at a high level to a gate of the transistor QN4 when the control signal RD is activated to a high level and the output signal of the NAND circuit 83 is activated to a high level. With this, the transistor QN4 is turned on, and a potential at a high level is supplied to the drain of the transistor of the second reference cell R2.

The drive potential VWL from the word line drive circuit 40 is applied to the control gates of the transistor of the first reference cell R1 and the transistor of the second reference cell R2 (FIG. 1). The transistor QN5 has a drain that is connected to the sources of the transistor of the first reference cell R1 and the transistor of the second reference cell R2, and a source supplied with the reference power supply potential VSS. The transistor QN5 is turned on in accordance with the drive potential VWL applied to the gate, and supplies the reference power supply potential VSS to the sources of the transistor of the first reference cell R1 and the transistor of the second reference cell R2.

With this, the first reference cell R1 allows a current IR1 to flow in accordance with the drive potential VWL applied to the control gate, when the control signal RD is activated to a high level and the control signal XSAP is activated to a low level. Also, the second reference cell R2 allows a current IR2 to flow in accordance with the drive potential VWL applied to the control gate, when the control signal RD is activated to a high level and at least one of the control signals XSA0 to XSA3 is activated to a low level. On the other hand, the transistor QN5 disconnects the sources of the transistor of the first reference cell R1 and the transistor of the second reference cell R2 from the reference power supply potential VSS, when the drive potential VWL is not applied to the gate.

The first current mirror circuit CM1 generates the first mirror current that is proportional to the current IR1 flowing through the first reference cell R1, when the control signal RD is activated to a high level and the control signal XSAP is activated to a low level. The second current mirror circuit CM2 generates the second mirror current that is proportional to the current IR2 flowing through the second reference cell R2, when the control signal RD is activated to a high level and least one of the control signals XSA0 to XSA3 is activated to a low level.

The transistor QN1 has the drain and the gate that are connected to the drain of the transistor QP2 in the current mirror circuit CM1 and drains of the transistors QP40 to QP43 in the second current mirror circuit CM2. The transistor QN6 has a drain that is connected to the source of the transistor QN1, and a source supplied with the reference power supply potential VSS, and is turned on when the control signal RD that is applied to the gate is activated to a high level. Accordingly, the first mirror current or the second mirror current (first mirror current, second mirror current, or first mirror current and second mirror current) flows through the transistors QN1 and QN6 as the current IR3.

The sense amplifier 72 includes P-channel MOS transistors QP23 and QP24, an N-channel MOS transistor QN7, and an output circuit 72a, in addition to the transistors QN2, QP21, and QP22 shown in FIG. 3. Note that the N-channel MOS transistor QN8 is a transistor included in the switch circuit 60 (FIG. 2), and the N-channel MOS transistor QN9 is a transistor included in the transmission gate TG (FIG. 2).

The transistors QP23 and QP24 are connected between the interconnect of the logic power supply potential VDD and the respective transistors QP21 and QP22, and are turned on when the control signal RD is activated to a high level. The transistor QN7 has a drain connected to the source of the transistor QN2 and a source supplied with the reference power supply potential VSS, and is turned on when the control signal RD is activated to a high level. Therefore, when the control signal RD is activated to a high level, the transistor QN2 allows the reference current IR proportional to the current IR3 flowing through the transistor QN1 to flow.

The transistor QN8 has a drain connected to a drain of the transistor QP22 and a source connected to the drain of the transistor of a memory cell MC, and is turned on when the bit line selection signal SB for selecting the memory cell MC is activated to a high level. Also, the transistor QN9 has a drain connected to the source of the transistor of the memory cell MC and a source supplied with the reference power supply potential VSS, and is turned on in accordance with the drive potential VWL. Therefore, when the control signal RD and the bit line selection signal SB are activated to a high level, a current IM that corresponds to the stored data flows through the memory cell MC to which the drive potential VWL is applied.

The sense amplifier 72 compares, when the control signal RD is activated to a high level, the current IM flowing through the memory cell MC designated by the address signal with the reference current IR, and as a result, the data stored in the memory cell MC is read out. The output circuit 72a generates the output signal OUT based on the potential at the connection point between the drain of the transistor QP22 and a drain of the transistor QN8.

For example, the sense amplifier 72, when the current IM flowing through the memory cell MC is larger than the reference current IR, brings the output signal OUT to a low level, and when the current IM flowing through the memory cell MC is smaller than the reference current IR, brings the output signal OUT to a high level.

The selection circuit 80 sets the selection state of the first reference cell R1 and the second reference cell R2 such that, in the readout mode, the reference current IR is generated based on at least the first mirror current, and in the verify mode, the reference current IR is generated based on the second mirror current.

The setting as to whether the reference current IR is generated based on only the first mirror current, or the reference current IR is generated based on the first mirror current and the second mirror current, in the readout mode, may be fixed when shipping inspection of the semiconductor device is performed, or may be configured to be able to be changed after shipment.

Assume that, in the following, the first reference cell R1 is set in the intermediate state between the erased state and the programmed state, and the second reference cell R2 is set in the erased state, as an example. Accordingly, the current supply capability of the reference cell used for generating the reference current IR can be improved, and it is possible to reduce the time it takes for the reference current IR to stabilize in the readout mode. As a result, high-speed readout of data is made possible.

In this case, the selection circuit 80 may set the state of connection between the second reference cell R2 and the second current mirror circuit CM2, or the connection state of the second current mirror circuit CM2 such that the second mirror current is generated in the verify mode, and the second mirror current is not generated in the readout mode. With this, the reference current IR can be generated, in the readout mode, at a high speed using only the intermediate state first reference cell R1, and the operation margin can be increased compared with a case where both the first reference cell R1 and the second reference cell R2 are used, because the reference current IR changes similarly to the current IM of the memory cell MC with respect to a change in temperature or the power supply voltage.

Alternatively, the selection of the reference cells in the readout mode may be performed based on the power supply voltage (VDD-VSS) that is supplied to the memory control circuit 70. In this case, a voltage detection circuit 74 that activates a detection signal DET when the power supply voltage (VDD-VSS) is higher than a predetermined voltage is provided in the memory control circuit 70.

The selection control circuit 73 controls the selection circuit 80 such that, in the readout mode, the reference current IR is generated based on the first mirror current when the detection signal DET is activated, and the reference current IR is generated based on the first mirror current and the second mirror current when the detection signal DET is not activated.

Accordingly, when the power supply voltage (VDD-VSS) is relatively high, the reference current IR can be generated at a high speed using only the first reference cell R1. On the other hand, when the power supply voltage (VDD-VSS) is relatively low, although the intermediate state first reference cell R1 is not easily turned on, the reference current IR can be generated using the second reference cell R2, even if the first reference cell R1 is not turned on.

Memory Control Circuit 3

Figure 6:
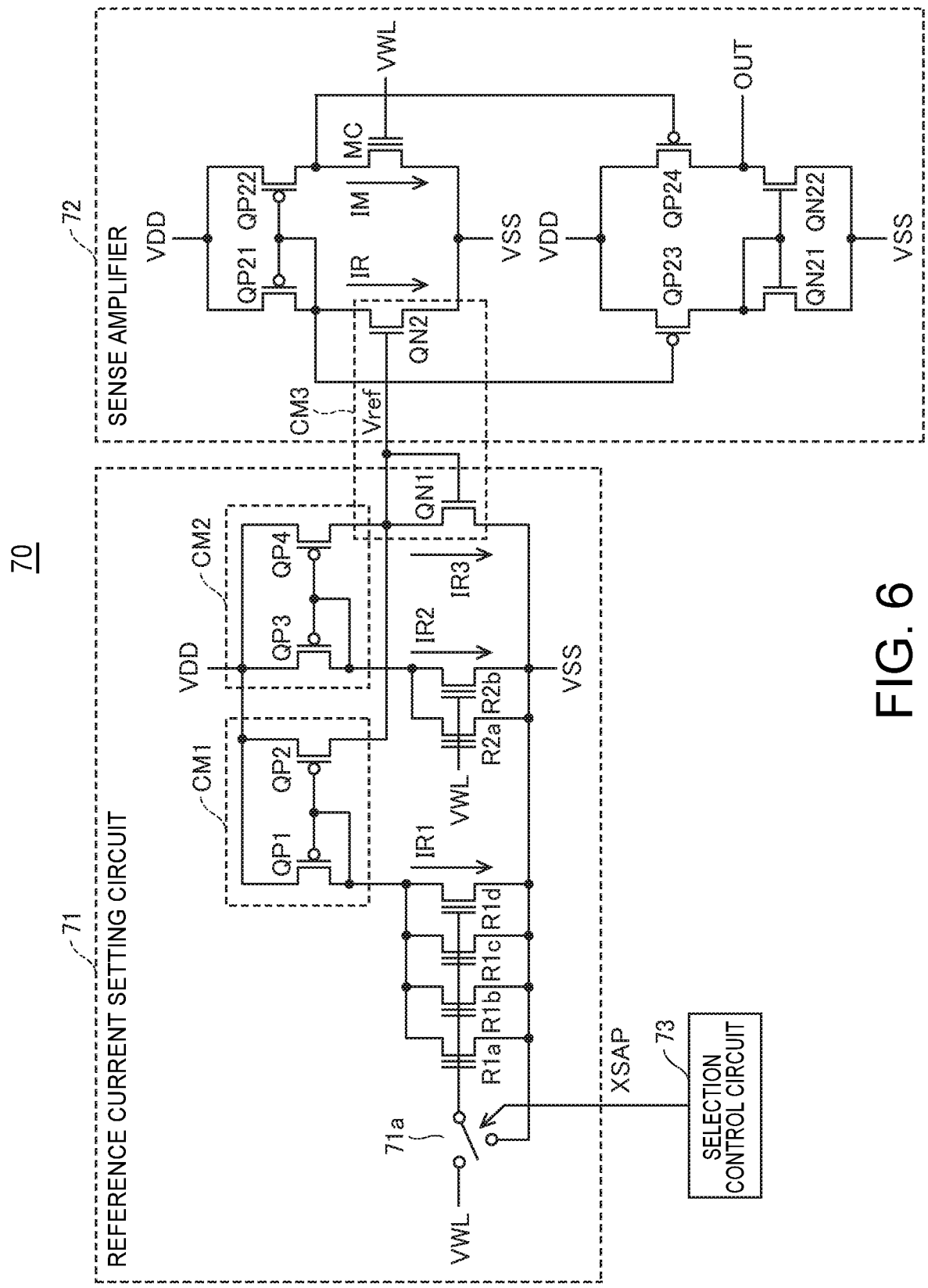
FIG. 6 is a circuit diagram illustrating a third exemplary configuration of the memory control circuit shown in FIG. 1.

FIG. 6 is a circuit diagram illustrating a third exemplary configuration of the memory control circuit 70 shown in FIG. 1. In the third exemplary configuration, a plurality of first reference cells (four first reference cells R1a to R1d are shown in FIG. 6, as an example) are connected in parallel, and a plurality of second reference cells (two second reference cells R2a and R2b are shown in FIG. 6, as an example) are connected in parallel. In other respects, the third exemplary configuration may be similar to the first exemplary configuration.

Each of the first reference cells R1a to R1d and the second reference cells R2a and R2b is constituted by an N-channel MOS transistor that has a control gate, a floating gate, a source, and a drain, similarly to the memory cell MC, for example. Each of the first reference cells R1a to R1d is set to the intermediate state between the erased state and the programmed state, or in the programmed state. On the other hand, each of the second reference cells R2a and R2b are set in the erased state.

The transistors of the first reference cells R1a to R1d and the transistors of the second reference cells R2a and R2b have respective sources to which reference power supply potential VSS is supplied, and respectively allow currents IR1 and IR2 to flow when a potential at a high level is applied to the drains, in accordance with the drive potential VWL applied to the control gates. Here, the current IR1 represents the sum of currents flowing through the first reference cells R1a to R1d, and the current IR2 represents the sum of currents flowing through the second reference cells R2a and R2b.

In the reference current setting circuit 71, the first current mirror circuit CM1 constituted by the transistors QP1 and QP2 generates the first mirror current proportional to the current IR1 flowing through the first reference cells R1a to R1d in a state in which the first reference cells R1a to R1d are selected.

Also, the second current mirror circuit CM2 constituted by the transistors QP3 and QP4 generates the second mirror current proportional to the current IR2 flowing through the second reference cells R2a and R2b in a state in which the second reference cells R2a and R2b are selected.

The first mirror current or the second mirror current flows through the transistor QN1 as a current IR3. The third current mirror circuit CM3 constituted by the transistors QN1 and QN2 generates the reference current IR proportional to the current IR3. The sense amplifier 72 compares the current IM flowing through the memory cell MC with the reference current IR so as to read out the data stored in the memory cell MC.

The selection circuit 71a sets the selection state of the first reference cells R1a to R1d and the second reference cells R2a and R2b under the control of the selection control circuit 73. With this, in the readout mode, the reference current IR is generated based on at least the first mirror current, and in the verify mode, the reference current IR is generated based on the second mirror current.

As a result of providing the four first reference cells R1a to R1d, the current IR1 flowing through the first reference cells R1a to R1d is quadrupled relative to the current flowing through each of the first reference cells R1a to R1d. Also, as a result of providing the two second reference cells R2a and R2b, the current IR2 flowing through the second reference cells R2a and R2b is doubled relative to the current flowing through each of the second reference cells R2a and R2b. As a result of adjusting the mirror ratio of any of the first to third current mirror circuits CM1 to CM3 in accordance therewith, the current value of the reference current IR can be appropriately set.

In the case where the number of bits of data to be read out at the same time is large, the current mirror circuit that generates a current corresponding to the current flowing through the reference cell is connected to a large number of sense amplifiers, and the interconnect length increases as well, and as a result, the load capacitance of the current mirror circuit increases, and it takes time for the reference current to stabilize. Specifically, the problem becomes apparent with respect to the programmed state reference cell whose threshold voltage is high, because the current supply capability is low.

Therefore, according to the third exemplary configuration, as a result of providing the plurality of first reference cells, the current supply capability of the reference cell used for generating the reference current IR can be improved, and it is possible to reduce the time it takes for the reference current IR to stabilize, in the readout mode. As a result, high-speed readout of data is made possible. Also, as a result of providing the plurality of first reference cells or the plurality of second reference cells, the influence of variation in the threshold voltage of the reference cell due to process variations can be reduced.

Electronic Apparatus

Next, an electronic apparatus according to one embodiment of the invention will be described with reference to FIG. 7.

Figure 7:
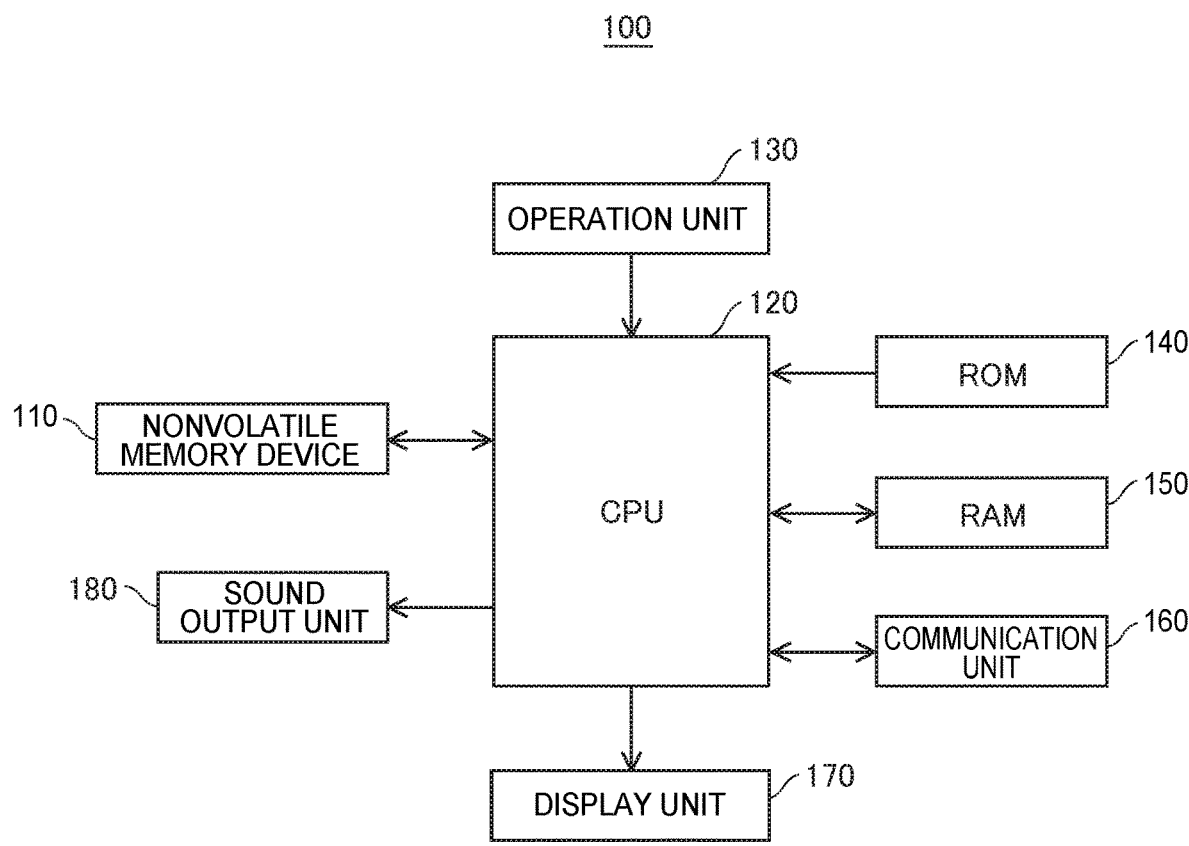
FIG. 7 is a block diagram illustrating an exemplary configuration of an electronic apparatus according to one embodiment of the invention.

FIG. 7 is a block diagram illustrating an exemplary configuration of the electronic apparatus according to one embodiment of the invention. As shown in FIG. 7, the electronic apparatus 100 includes a nonvolatile memory device 110 according to one embodiment of the invention, a CPU 120, an operation unit 130, a ROM (Read Only Memory) 140, a RAM (Random Access Memory) 150, a communication unit 160, a display unit 170, and a sound output unit 180. At least some of the constituent elements shown in FIG. 7 may be incorporated in a semiconductor device (IC). Note that some of the constituent elements shown in FIG. 7 may be omitted or changed, or another constituent element may be added to the constituent elements shown in FIG. 7.

The nonvolatile memory device 110 stores various types of data and the like. The CPU 120 performs various types of computation processing and control processing using data read out from the nonvolatile memory device 110 in accordance with a program stored in the ROM 140 or the like. For example, the CPU 120 performs various types of data processing in accordance with an operation signal supplied from the operation unit 130, controls the communication unit 160 for performing data communication with the outside, generates image signals for displaying various types of images in the display unit 170, and generates sound signals for outputting various types of sounds from the sound output unit 180, for example.

The operation unit 130 is an input device including an operation key, a button switch, and the like, and supplies an operation signal according to an operation made by a user to the CPU 120, for example. The ROM 140 stores programs for the CPU 120 to perform various types of computation processing and control processing. Also, the RAM 150 is used as a work area for the CPU 120, and temporarily stores a program read out from the ROM 140 or the like, data read out from the nonvolatile memory device 110, data that has been input using the operation unit 130, a result of computation that the CPU 120 has performed in accordance with a program, and the like.

The communication unit 160 is constituted by an analog circuit and a digital circuit, and performs data communication between the CPU 120 and an external device. The display unit 170 includes an LCD (liquid crystal display device) or the like, and displays various types of images in accordance with a display signal supplied from the CPU 120, for example. Also, the sound output unit 180 includes a speaker or the like, for example, and outputs various types of sounds based on a sound signal supplied from the CPU 120.

The electronic apparatus 100 includes a position determination function using GPS or the like, a body motion detection function using a body motion sensor or the like, a body information acquisition function using a pulse wave sensor or the like, a time measurement function, and the like, for example, and may be a wrist apparatus to be attached to a wrist or the like of a user.

In addition, the electronic apparatus 100 corresponds, for example, to a clock such as a sport watch or a table clock, a timer, a mobile apparatus such as a mobile phone or a mobile information terminal, an audio apparatus, a digital still camera, a digital video camera, a television, a TV phone, a security television monitor, a head-mounted display, a personal computer, a printer, a network apparatus, a multifunction peripheral, an on-board device (such as a navigation device), a calculator, an electronic dictionary, an electronic game machine, a robot, a measurement device, a medical apparatus (electronic thermometer, sphygmomanometer, blood glucose meter, electrocardiograph device, ultrasonic diagnostic apparatus, and electronic endoscope, for example), or the like.

According to the present embodiment, a semiconductor device or an electronic apparatus can be provided in which, in the nonvolatile memory device 110, the determination reference can be precisely set when verifying whether or not a memory cell has been properly programmed to a programmed state in which the threshold voltage of the memory cell is high. Accordingly, as a result of storing the program in the nonvolatile memory device 110, the ROM 140 may be omitted.

The invention is not limited to the embodiments described above, and many modifications can be made within the technical idea of the invention by a person having ordinary skill in the art. For example, a plurality of embodiments selected from the embodiments given above can be combined and implemented.

What is claimed is:

1. A nonvolatile memory device comprising:
a first reference cell in an intermediate state between an erased state and a programmed state or in the programmed state;
a second reference cell in the erased state;
a first current mirror circuit that generates a first mirror current proportional to a current flowing through the first reference cell in a state in which the first reference cell is selected;
a second current mirror circuit that generates a second mirror current proportional to a current flowing through the second reference cell in a state in which the second reference cell is selected;
a sense amplifier that reads out data stored in a memory cell by comparing a current flowing through the memory cell with a reference current; and
a selection circuit that sets a selection state of the first reference cell and the second reference cell such that, in a readout mode, the reference current is generated based on at least the first mirror current, and in a verify mode, the reference current is generated based on the second mirror current.

2. The nonvolatile memory device according to claim 1, wherein the selection circuit sets a state of connection between the first reference cell and the first current mirror circuit or a connection state of the first current mirror circuit such that the first mirror current is generated in the readout mode, and the first mirror current is not generated in the verify mode.

3. The nonvolatile memory device according to claim 1, wherein the reference current is generated based on the first mirror current and the second mirror current in the readout mode.

4. The nonvolatile memory device according to claim 1, wherein the first reference cell is set to the intermediate state between the erased state and the programmed state.

5. The nonvolatile memory device according to claim 4, wherein the selection circuit sets a state of connection between the second reference cell and the second current mirror circuit or the connection state of the second current mirror circuit such that the second mirror current is generated in the verify mode, and the second mirror current is not generated in the readout mode.

6. The nonvolatile memory device according to claim 4, further comprising:
a voltage detection circuit that activates a detection signal when a power supply voltage is higher than a predetermined voltage; and
a selection control circuit that controls the selection circuit such that, in the readout mode, the reference current is generated based on the first mirror current when the detection signal is activated, and the reference current is generated based on the first mirror current and the second mirror current when the detection signal is not activated.

7. The nonvolatile memory device according to claim 1, wherein the second current mirror circuit is configured such that a mirror ratio can be changed.

8. The nonvolatile memory device according to claim 1, further comprising:
a first transistor that is connected to the first current mirror circuit and the second current mirror circuit, and through which the first mirror current, the second mirror current, or the first mirror current and the second mirror current flow,
wherein the sense amplifier includes a second transistor that constitutes a third current mirror circuit together with the first transistor, and the second transistor allows the reference current proportional to a current flowing through the first transistor to flow.

9. The nonvolatile memory device according to claim 8, wherein the third current mirror circuit generates a current whose magnitude is approximately the same as a current flowing through the first reference cell, based on the first mirror current, and generates a current whose magnitude is β (0<β<1) times a current flowing through the second reference cell, based on the second mirror current.

10. A semiconductor device comprising the nonvolatile memory device according to claim 1.

11. An electronic apparatus comprising the nonvolatile memory device according to claim 1.

12. A nonvolatile memory device comprising:
- a first reference cell configured to be in an intermediate state between an erased state and a programmed state or in the programmed state;
- a second reference cell configured to be in the erased state;
- a first current mirror configured to generate a first current proportional to a current flowing through the first reference cell when the first reference cell is selected;
- a second current mirror that is configured to generate a second current proportional to a current flowing through the second reference cell when the second reference cell is selected;
- a sense amplifier that is configured to read out data stored in a memory cell by comparing a current flowing through the memory cell with a reference current; and
- a selector that is configured to select the first reference cell and the second reference cell such that, in a readout mode, the reference current is generated based on at least the first current, and in a verify mode, the reference current is generated based on the second current.

* * * * *